United States Patent [19]

Reiff et al.

[11] Patent Number: 5,173,220
[45] Date of Patent: Dec. 22, 1992

[54] METHOD OF MANUFACTURING A THREE-DIMENSIONAL PLASTIC ARTICLE

[75] Inventors: David E. Reiff, Fort Lauderdale; Dale W. Dorinski, Coral Springs; Stephen D. Hunt, Davie, all of Fla.

[73] Assignee: Motorola, Inc., Schaumburg, Ill.

[21] Appl. No.: 691,769

[22] Filed: Apr. 26, 1991

[51] Int. Cl.5 .................. B29C 35/08; B29C 41/20
[52] U.S. Cl. .................. 264/22; 156/272.8; 156/273.5; 156/275.5; 156/298; 156/303.1; 156/307.1; 264/25; 264/257; 264/272.17; 264/308; 427/96; 427/195; 427/393.5; 427/407.1; 427/510; 427/512; 427/581
[58] Field of Search .......... 264/22, 25, 257, 271.1, 264/272.11, 272.13, 271.15, 272.17, 279, 279.1, 308; 156/62.2, 272.8, 273.3, 273.5, 275.5, 298, 303.1, 307.1; 427/35, 43.1, 44, 53.1, 54.1, 55, 96, 189, 195, 385.5, 393.5, 407.1; 364/468, 476, 477, 522

[56] References Cited

U.S. PATENT DOCUMENTS

| | | | |
|---|---|---|---|
| 4,358,331 | 11/1982 | Schmidt et al. | 156/275.5 |
| 4,752,498 | 6/1988 | Fudim | 427/54.1 |
| 4,822,536 | 4/1989 | Voinis et al. | 264/22 |
| 4,863,538 | 9/1989 | Deckard | 156/62.2 |
| 4,929,402 | 5/1990 | Hull | 264/22 |
| 4,943,928 | 7/1990 | Campbell et al. | 364/477 |
| 4,996,010 | 2/1991 | Modrek et al. | 264/22 |
| 4,999,143 | 3/1991 | Hull et al. | 264/22 |

*Primary Examiner*—Leo B. Tentoni
*Attorney, Agent, or Firm*—Dale W. Dorinski

[57] ABSTRACT

A method for producing a three dimensional plastic article having an insert. The three dimensional plastic article (20) is formed by exposing a liquid photopolymer or other material (14) capable of selective solidification or curing to a source of energy (10), preferably a laser beam (30). A portion of the three dimensional plastic article is formed by selectively exposing portions of the surface (12) of the liquid photopolymer to the laser beam. The insert (26) is placed onto the partially formed article (20), and the remainder of the article is formed by selectively exposing additional portions of the surface (16) of the liquid polymer to the laser beam, creating successive layers, whereupon a plurality of the layers form the three dimensional article (20). The insert (26) becomes an integral part of the completed three-dimensional article.

15 Claims, 4 Drawing Sheets

METHOD OF MANUFACTURING A THREE-DIMENSIONAL PLASTIC ARTICLE

TECHNICAL FIELD

This invention relates generally to methods of forming three-dimensional objects and more particularly to applications of stereolithographic techniques to the production of three-dimensional objects.

BACKGROUND

It is common practice in the production of plastic parts and the like to first design the part and then painstakingly produce a prototype of the part, each step involving considerable time, effort, and expense. The design is then reviewed, and often times the process is repeated until the design has been optimized. After optimization, the next step is production. Most production plastic parts are injection molded. Since the design time and tooling costs are very high, plastic parts are usually practical only in high-volume production. While other processes are available for the production of low-volume plastic parts, including direct machining, vacuum forming, direct forming, and compression molding, these methods are typically only cost effective for short run production and the parts produced are usually inferior in quality to injection molded parts.

Plastic parts possess many advantages including light weight, low cost, electrical resistivity, and resistance to many chemicals. However, in many cases, the physical properties of the plastic part are not sufficient for the intended application and an insert made from another material such as metal (to provide additional properties not inherent to the plastic, such as conductivity) is often placed in the part. The use of inserts in injection molding is well known to those skilled in the art. It can therefore be appreciated that using these types of inserts is an expensive and cumbersome process because the inserts must be carefully placed in the mold prior to each molding cycle. Injection molded parts having inserts are much more expensive than parts without inserts because of the additional labor involved and the increase in cycle time of the molding process. In addition, the tooling required to accommodate structural inserts in both injection molding and vacuum forming systems is much more complicated and expensive.

Hence, there continues to be an existing need in the design and production of plastic parts for an enhanced capability to rapidly and reliably move from the design stage to a prototype stage and to ultimate production of plastic parts having inserts. Accordingly, those concerned with the production of these types of three-dimensional objects have long recognized the desirability of a system or a method that would provide a rapid, reliable, economical, and automatic means to quickly move from the design stage to a prototype or low volume production stage of parts having inserts. The present invention clearly fulfills all of these needs.

SUMMARY OF THE INVENTION

Briefly, according to the invention, there is provided a method for producing a three dimensional plastic article having an insert. The three dimensional plastic article is formed by exposing a medium capable of selective physical transformation to a source of synergistic stimulation, such as a laser beam. A portion of the three dimensional plastic article is formed by selectively exposing portions of the surface of the medium to the laser beam. The insert is placed onto the partially formed article such that the insert is fixtured in the article, and the remainder of the article is formed by selectively exposing further portions of the surface of the medium to the laser beam, whereupon the insert is captivated and becomes a part of the three dimensional article.

In a further embodiment of the invention, there is provided a method of producing a chip carrier. A computer-based model of the chip carrier is made, and a support structure is formed by selectively exposing the surface of a liquid photopolymer to a laser beam of ultraviolet light. A substrate having an integrated circuit electrically and mechanically attached to the substrate is located on the support structure. The remaining layers of the chip carrier are formed by selectively exposing the surface of the material to the beam of ultraviolet light, and recoating the chip carrier and exposing the photopolymer so as to form a plurality of successive layers that create a chip carrier having an integrated circuit substantially contained within the carrier.

DETAILED DESCRIPTION OF THE PREFERRED EMBODIMENT

The present invention provides a new and improved method for generating a three-dimensional object having an insert by forming successive adjacent layers of that object at the surface of a medium capable of altering its physical state in response to an appropriate synergistic stimulation. In the presently preferred embodiment, by way of example and not necessarily by way of limitation, the present invention utilizes the principles of computer aided design (CAD), stereolithography, and insert molding. The principles of this invention can be applied for the purposes of sculpting models for prototypes in a design phase of product development, as a low-volume manufacturing system, or even as a pure art form by creating a computer based model of the desired object. Methods of creating such a model are well known to those skilled in the art, and it may be appreciated that numerous types of computer models (i.e. solid, surfaced, wire-frame, etc.) may be employed in order to fabricate an object.

Stereolithography is a method for making solid objects by successively forming thin layers of a solid material, one layer on top of the other. The solid material is formed by selectively exposing portions of a liquid or powdered material to a source of energy. The material may be, for example, a metal or plastic powder that is heated to cause melting or fusing of the powder, a chemically reactive material that cures on exposure to a second chemical, or a liquid photopolymer that cures or polymerizes upon exposure to ultraviolet (UV) light. Such systems undergo a physical transformation by synergistic stimulation of the material. In the preferred embodiment, a UV curable liquid photopolymer is employed.

The techniques of stereolithography are relatively new. However, a number of systems or methods have been proposed or are currently existing in production. The most popular of these is a method of curing a liquid photopolymer with ultraviolet light. Other methods include sintering metals or powders using a laser light beam, focussed heat, x-ray beams, visible light beams, high energy particles, an electron beam, chemically reacting a material with a jet of a reactant material, or by placing a mask over the surface of the uncured material, the mask having openings corresponding to the physical features of the desired object. When such a mask is used, a concentrated beam is not required and the surface of the material may then be flooded with the energy source, for example, flooding with ultraviolet light, heat, or a chemical source.

Figure 1:
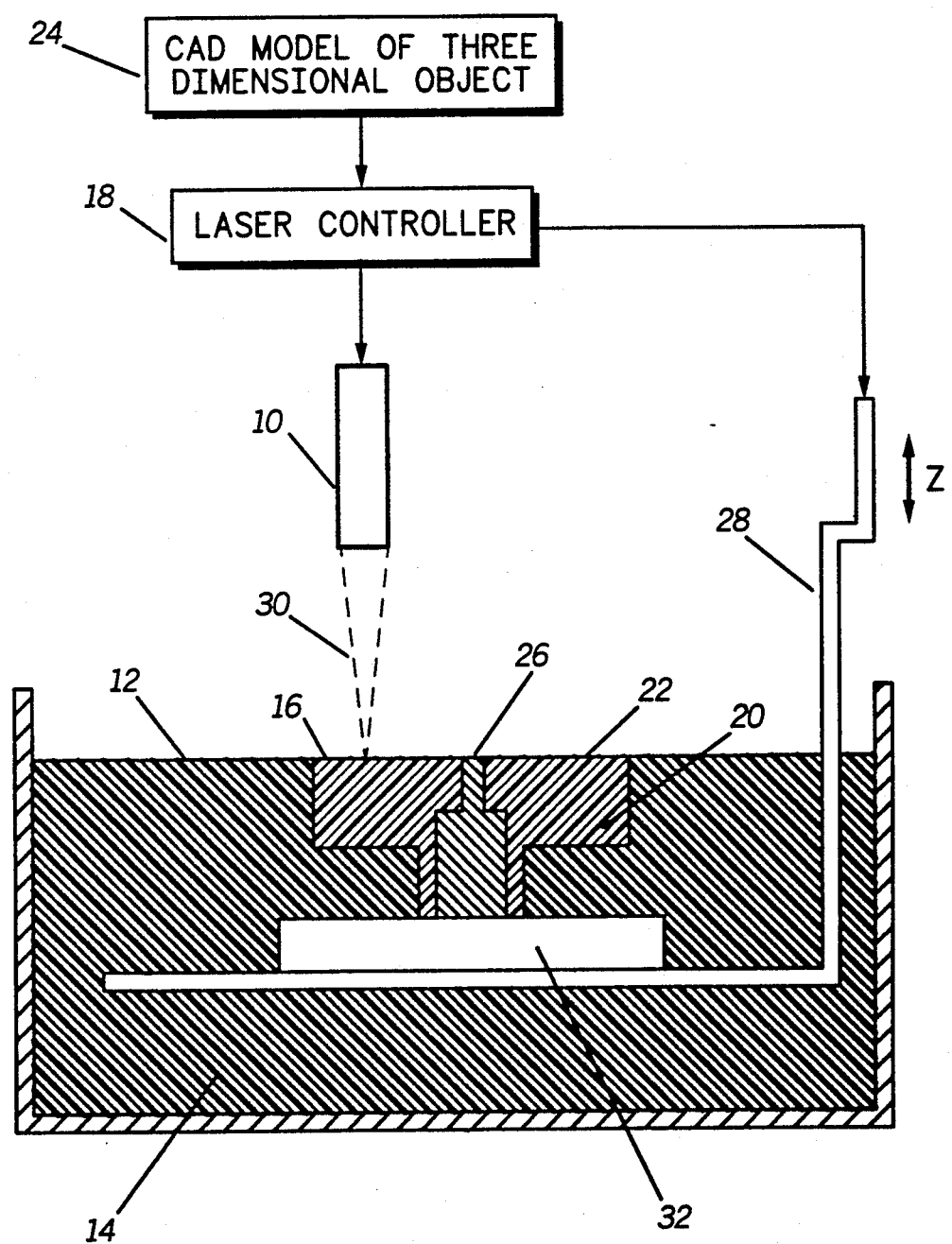
FIG. 1 is a schematic of a three-dimensional plastic article being fabricated in a stereolithographic apparatus in accordance with the present invention.

Referring now to FIG. 1, the programmable beam of an ultraviolet laser (10) serves as the energy source, and is moved across the surface (12) of the UV curable liquid material (14) in order to convert selected portions (16) of the liquid to a solid. A solid polymer is thus formed at the surface of the liquid. The UV light beam (30) is controlled by a computer (18) and cures the photopolymer material in areas corresponding to the computer based model (24) of the three-dimensional article (20). The partially formed object (20) is then moved away from the liquid surface (12) by lowering the stage (28) in order to recoat the surface of the object with uncured material (14), forming a thin layer of uncured material (22) over the surface of the object. A second layer of the object is then created in a manner similar to the first layer by moving the UV light beam and selectively curing the material. Because each layer of the object (20) has a finite thickness and the penetration depth of the laser beam (30) is also finite and controllable, successive layers become adhered to the layer immediately beneath and a solid structure (20) is formed. The process is continued until the entire object is formed.

Many types of complex three-dimensional forms can be created with the technique of stereolithography. Unfortunately, the plastics typically employed in stereolithography are weak and brittle. In the present invention, the stereolithographic technique is expanded to incorporate a method of fabricating a three-dimensional object (20) having a structural or other insert (26). Inserts are manufactured from a metal, a plastic, or other material and placed in the partially formed stereolithographic part to form objects having unique physical properties. Intricate, three-dimensional geometry is created around the insert using stereolithography as shown in FIG. 1. These inserts may be used in a way similar to those typically used in injection or compression molding, that is, to add strength or properties to the finished part that would be unachievable given the limitations of the base material. Given the weak and brittle nature of polymers used in stereolithography, the use of structural inserts is highly desirable. The insert itself may be made from a number of materials such as metals, other polymers, structural foams, fiber-reinforced polymers (containing materials such as carbon, aramid or glass), elastomers, very fragile materials (such as glass structures), ceramics, woven fabrics (made from fibers of glass, carbon, polyester, or aramid), discrete fibers (such as glass, carbon, polyester, or aramid), powdered fillers (inorganic materials or other polymers) and metal films or foil. It can be appreciated that the use of many of these types of inserts is difficult if not impossible to employ in techniques such as injection molding because of the high temperature and pressures required for the injection molding process. Because the stereolithography method does not employ high temperatures or high pressures and is performed at ambient conditions, each of these materials may be quite easily utilized and incorporated into the final part.

The stereolithography machine is programmed to create a support structure (32) or initial layers of the part (20). This preliminary support (32) serves as a sacrificial structure to adhere the part (20) to the platform. The initial portion of the part (20) serves to support and align the insert (26), fixturing the insert so that it is precisely located in the partially formed port. After the support structure or portions of the part are made, the machine is halted and the insert (26) is placed or located into or onto the partially formed three-dimensional object. The stereolithographic process is then continued and the remaining layers of the part are built up around the insert such that the insert is captivated in the port. The use of complex shaped inserts is easily accommodated because of the ability to create a computer generated model prior to fabricating the part. After the final layer of the three-dimensional object is drawn on the surface of the liquid, the object is removed and typically subjected to a final curing step, and removal of the support structure. However, this curing step is optional and depends upon the type of material utilized. If a final curing step is desired, the curing step is typically performed by flooding the part with ultraviolet light energy or by heating the part in an oven in order to effect further polymerization and final cure by thermal means. Techniques for effecting the final cure by immersing the fabricated three-dimensional object under water are shown in U.S. Pat. No. 4,996,010 by Modrek, assigned to 3-D Systems, Inc. of Valencia, Calif.

Figure 2:
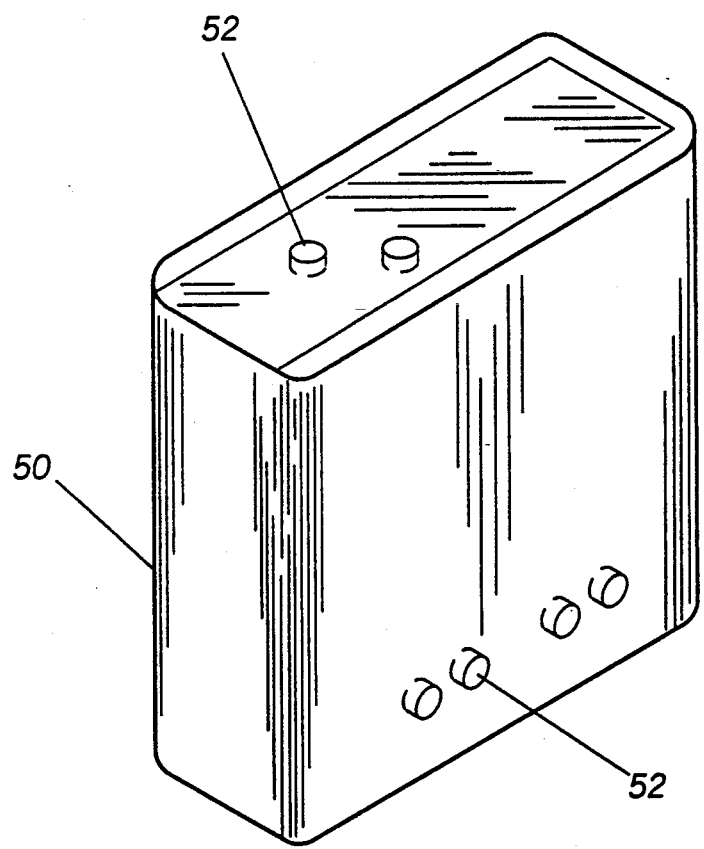
FIG. 2 is an isometric view of a three-dimensional plastic battery housing in accordance with the present invention.
Figure 3:
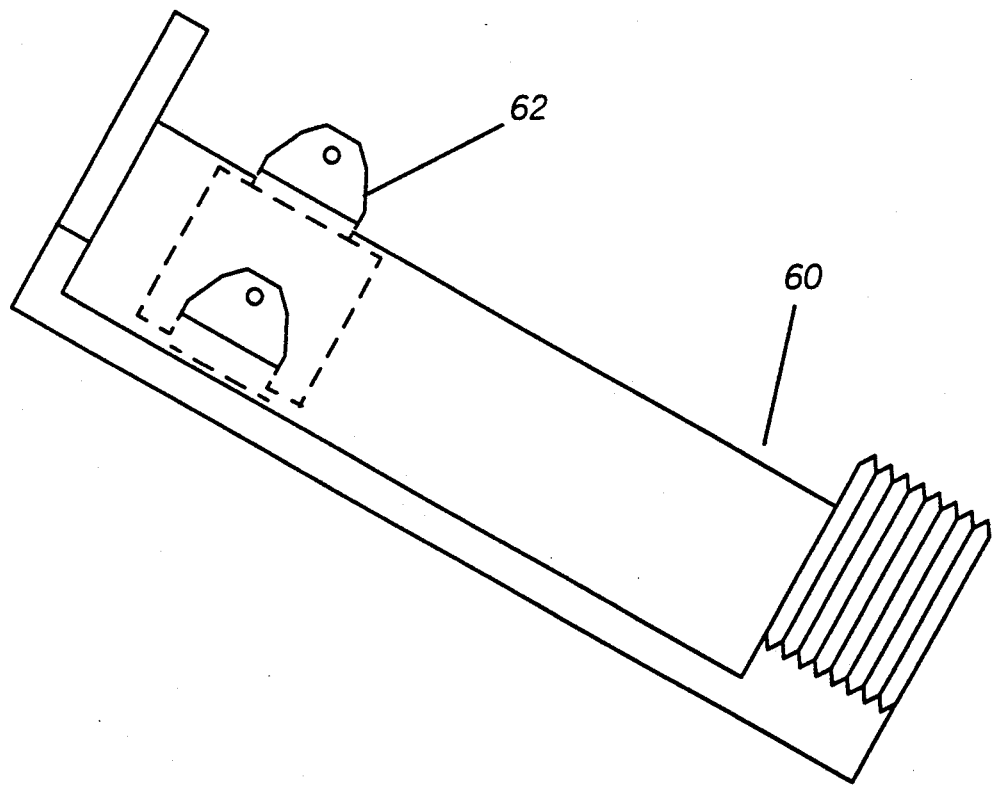
FIG. 3 is an isometric view of a three-dimensional plastic belt clip in accordance with the present invention.

Referring now to FIG. 2, the insert (52) may be entirely contained within the boundaries of the finished three-dimensional object (50), as for example the electrical terminal contacts of a battery housing for a portable radio. In other cases (FIG. 3), the insert (62) may protrude beyond one or more surfaces of the three-dimensional object (60) in order to provide a foundation for mechanical attachment. One example of such an arrangement is a belt clip (60) for a radio of similar article, having a metal bracket (62) integrally formed with the belt clip.

Figure 4:
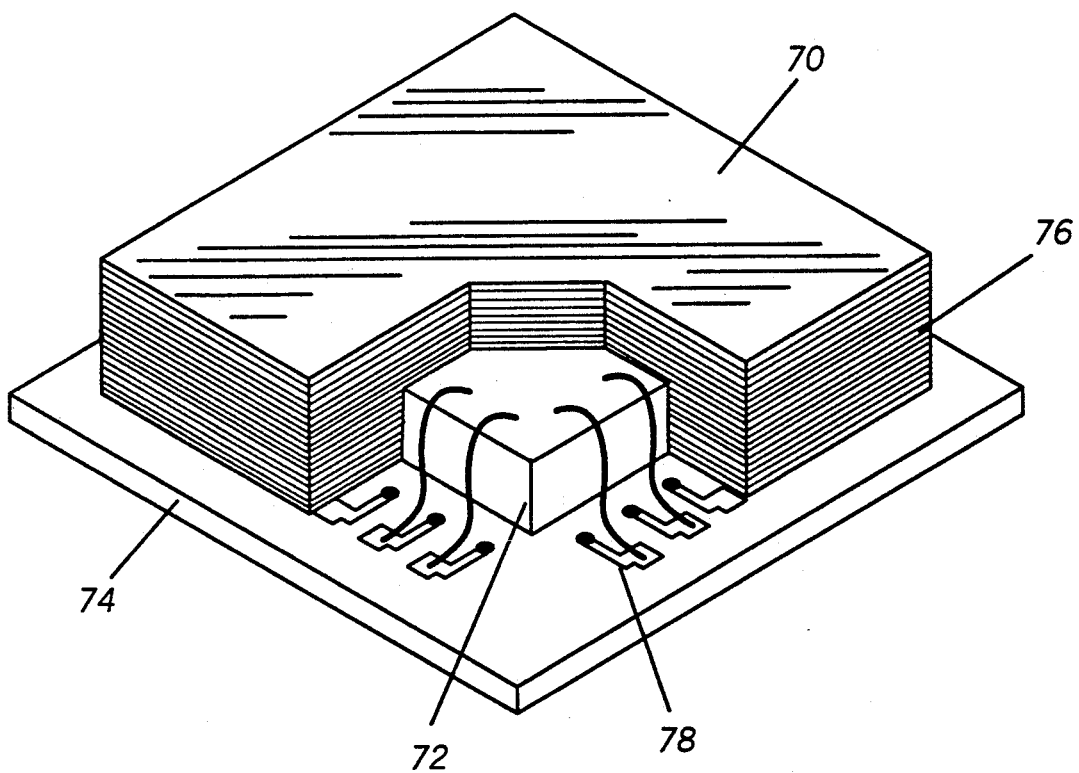
FIG. 4 is a cut-away isometric view of a chip carrier in accordance with the present invention.

Referring now to FIG. 4, in another embodiment of the invention, a three-dimensional object such as a chip carrier is formed for use in an electronic device such as a portable radio or computer. The chip carrier (70) is fabricated by electrically and mechanically attaching an integrated circuit (72) to a substrate (74) having electrical interconnections (78). The substrate is typically ceramic, a printed circuit board, or a flexible film, but may be other materials typically used in the art to mount integrated circuits. A temporary support structure is formed on the sterolithography stage and the substrate (74) with the integrated circuit (72) is placed on the support structure. The chip carrier (70) is then formed by creating layers (76) of cured polymer around the integrated circuit and the substrate as in the manner previously described. The layering process is continued until the integrated circuit (72) is encapsulated, and the chip carrier (70) is removed and subjected to a final post cure.

The key feature of the present invention in providing parts with improved structural integrity or physical properties resides in the use of an insert in a part fabricated by sterolithography. The new and improved stereolithographic method has numerous advantages over current methods for producing plastic three-dimensional objects. The method of the present invention avoids the need of producing tooling and allows the designer to work directly with the computer and a stereolithographic device in order to fabricate the desired object. Inserts of widely varying materials can now be employed, and located within a three-dimensional object with a greater degree of precision and accuracy than previously available using injection molding techniques. Inherent weaknesses of the stereolighographic process associated with the use of brittle and weak polymers have been alleviated by incorporating structural inserts. The present invention satisfies a long-existing need for an improved method in the art for a system capable of rapidly, reliably, accurately, and economically designing and fabricating three-dimensional plastic parts having an insert. It will be apparent from the foregoing that while particular forms of the invention have been illustrated and described, various modifications can be made without departing from the spirit and the scope of the invention. Accordingly, it is not intended that the invention be limited except as by the appended claims.

What is claimed is:

1. A method for producing a three dimensional object having an insert, comprising:
   providing a reservoir of material capable of altering its physical state when exposed to a radiant beam, the material having a designated upper working surface;
   forming a portion of the three dimensional object by selectively exposing said working surface to the radiant beam, creating a first layer of the object;
   coating the partially formed three dimensional object with a further portion of the material by lowering the partially formed object into the material;
   fixturing the insert by placing the insert onto the partially formed three-dimensional object;
   continuing to form the three dimensional object by selectively exposing said working surface to the radiant beam; and
   repeating the coating and exposing steps, to form a plurality of successive layers comprising a three-dimensional object having the insert at least partially contained within the object.

2. The method as described in claim 1, wherein the material comprises a liquid.

3. The method as described in claim 2, wherein the material comprises a photopolymer.

4. The method as described in claim 1, wherein the material comprises a powder.

5. The method as described in claim 1, further comprising a final step of further transforming the three dimensional object by exposing it to a further source of radiant energy.

6. The method as described in claim 1, wherein the radiant beam is selected from the group consisting of laser energy, thermal energy, x-ray energy, electron beams, and a beam of high energy particles.

7. The method as described in claim 1, wherein the insert comprises a second material.

8. The method as described in claim 7, wherein the second material is selected from the group consisting of metals, plastics, ceramics, glass, elastomers, and electrical components.

9. A method of producing a three dimensional object having an insert, comprising:
   creating a computer-based model of the object;
   providing a reservoir of a liquid polymer material capable of solidification upon exposure to ultraviolet light;
   forming a first layer of the object by selectively exposing the surface of the material to a beam of ultraviolet light so as to solidify the selectively exposed surface;
   coating the first layer of the object with a thin coating of the liquid material;
   locating the insert comprising a second material onto an upper surface of the partially formed object;
   forming further layers of the object by selectively exposing the surface of the material to the beam of ultraviolet light so as to solidify the selectively exposed surface; and
   repeating the coating and exposing steps so as to form a plurality of successive layers comprising the three dimensional object at least partially containing the insert.

10. The method as described in claim 9, further comprising a final step of solidifying the three dimensional object by exposing it to ultraviolet light.

11. The method as described in claim 9, further comprising a final step of solidifying the three dimensional object by exposing it to heat.

12. The method as described in claim 9, wherein the second material is selected from the group consisting of metals, plastics, ceramics, glass, elastomers, and electrical components.

13. The method as described in claim 9, wherein the beam of ultraviolet light comprises a laser beam.

14. A method of producing a chip carrier, comprising:
   creating a computer-based model of the chip carrier;
   providing a reservoir of a liquid polymer material capable of solidification upon exposure to ultraviolet light;
   forming a support structure by selectively exposing the surface of the material to a laser beam of ultraviolet light so as to solidify the selectively exposed surface;
   placing a substrate having an integrated circuit on the support structure;
   coating at least the support structure with a thin coating of the material;
   forming a layer of the chip carrier by selectively exposing the surface of the material to the beam of ultraviolet light so as to solidify the selectively exposed surface; and
   repeating the coating and exposing steps so as to form a plurality of successive layers comprising the chip carrier substantially containing the integrated circuit, portions of the substrate remaining uncoated with the solidified material.

15. The method as described in claim 14, further comprising a final step of solidfying the chip carrier by exposing it to ultraviolet light.

* * * * *